(12) United States Patent
Kudva et al.

(10) Patent No.: US 8,511,461 B2
(45) Date of Patent: Aug. 20, 2013

(54) GAS-EJECTING BEARINGS FOR TRANSPORT OF GLASS SHEETS

(75) Inventors: Gautam Narendra Kudva, Horseheads, NY (US); Weiwei Luo, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 379 days.

(21) Appl. No.: 12/465,859

(22) Filed: May 14, 2009

(65) Prior Publication Data

US 2010/0126830 A1 May 27, 2010

Related U.S. Application Data

(60) Provisional application No. 61/117,683, filed on Nov. 25, 2008.

(51) Int. Cl.
*B65G 45/22* (2006.01)
*C03B 35/24* (2006.01)

(52) U.S. Cl.
USPC ............ 198/493; 198/721; 65/25.2; 65/25.1; 65/25.4; 65/29.15

(58) Field of Classification Search
None
See application file for complete search history.

(56) References Cited

U.S. PATENT DOCUMENTS

| 5,027,941 | A | 7/1991 | Lenhardt | 198/721 |
| 5,565,040 | A | 10/1996 | Donlan, Jr. et al. | 134/26 |
| 6,505,483 | B1* | 1/2003 | Hoetzl et al. | 65/25.2 |
| 7,108,123 | B2 | 9/2006 | Zeidler et al. | 198/493 |
| 7,428,959 | B2 | 9/2008 | Jung et al. | 198/493 |
| 2003/0037573 | A1* | 2/2003 | Langsdorf et al. | 65/158 |
| 2005/0040338 | A1 | 2/2005 | Weiss et al. | 250/358.1 |
| 2005/0126605 | A1 | 6/2005 | Yassour et al. | 134/34 |
| 2006/0017676 | A1 | 1/2006 | Bowers et al. | 345/87 |
| 2006/0033899 | A1 | 2/2006 | Hazelton et al. | 355/53 |
| 2006/0054774 | A1 | 3/2006 | Yassour et al. | 248/631 |
| 2006/0219605 | A1* | 10/2006 | Devitt | 209/37 |
| 2007/0271756 | A1 | 11/2007 | Aoki et al. | 29/281.5 |

FOREIGN PATENT DOCUMENTS

| CN | 97190230.5 | 5/1998 |
| JP | 05-036658 | 2/1993 |
| JP | 10-158866 | 6/1998 |
| JP | 2001-213517 | 8/2001 |

(Continued)

OTHER PUBLICATIONS

Search Report for Taiwan Invention Patent Application No. 098139869; Filing Date: Nov. 23,2009; Date of Research: Sep. 24, 2012.

*Primary Examiner* — Kavel Singh
(74) *Attorney, Agent, or Firm* — Jeffrey A. Schmidt; Maurice M. Klee

(57) ABSTRACT

Non-contact, gas-ejecting bearings (3) are provided for conveying flexible glass sheets (13), such as LCD substrates, at high conveyance speeds, e.g., speeds of 40 meters/minute and above, e.g., 60 meters/minute. Gas is provided to the bearing's orifices (22) from a plenum which operates at a pressure $P_{plenum}$ and the bearings have a calculated static pressure $P_{midpoint}$ at the midpoints (27) between the bearing's centermost orifice (26) and each of its nearest neighbors (28) in a horizontal direction which satisfies the relationship $P_{midpoint}/P_{plenum} \geq 0.05$. The bearings (3) can reduce the time-averaged, peak-to-peak variation in the spacing between a LCD substrate (13) traveling at, for example, 60 meters/minute and the face (20) of the bearing (3) to less than 500 microns, thus reducing the chances that the substrate (13) will hit and be damaged by the bearing (3).

11 Claims, 4 Drawing Sheets

(56) References Cited

FOREIGN PATENT DOCUMENTS

| | | |
|---|---|---|
| JP | 2002-308423 | 10/2002 |
| JP | 2003-192127 | 7/2003 |
| JP | 2004-167833 | 6/2004 |
| JP | 2004/345744 | 12/2004 |
| JP | 2007-246287 | 9/2007 |
| TW | 200626461 | 8/2005 |

* cited by examiner

GAS-EJECTING BEARINGS FOR TRANSPORT OF GLASS SHEETS

RELATED APPLICATION

This application claims the benefit of U.S. Provisional Application No. 61/117,683, filed Nov. 25, 2008, entitled, "GAS-EJECTING BEARINGS FOR TRANSPORT OF GLASS SHEETS."

FIELD

This invention relates to methods and apparatus for transporting glass sheets, e.g., the glass sheets used as substrates in the manufacture of liquid crystal displays (LCDs). More particularly, the invention relates to transporting glass sheets without mechanical contact with the sheet's major surfaces.

BACKGROUND

The process of manufacturing substrates for liquid crystal displays includes a number of steps in which glass sheets need to be supported and conveyed without damage to the sheet's major surfaces and, in particular, without damage to the sheet's "quality" surface upon which components of the display, e.g., thin film transistors and color filters, will be formed. For example, during the substrate manufacturing process, sheets need to be cut to size, edge ground, washed, and packaged and shipped or otherwise provided to the display manufacturer. Not only does the sheet need to be transported between the stations at which these steps are performed, but in some cases, the sheet also needs to be turned (rotated) during a step.

As sheet size has grown from a length of 1 meter to greater than 2 meters without a corresponding increase in sheet thickness, the lateral stiffness of the sheet has significantly decreased. At the same time, transport speed requirements have either remained constant or increased. Thus, the problem of transporting glass substrates for liquid crystal displays as it exists today can be described as trying to move a large glass sheet whose mechanical properties are not unlike those of tissue paper at high speed without touching the major surfaces of the sheet.

The present invention addresses this problem by providing non-contact bearings which eject a gas (e.g., air) against at least one of the sheet's major surfaces in patterns which stabilize the sheet and thus reduce the sheet's transverse movement during transport, i.e., the sheet's movement in a direction orthogonal to the direction of transport. In this way, large and thin sheets of glass can be safely transported at high speeds.

SUMMARY

In accordance with a first aspect, there is provided a method for conveying a glass sheet (13) including:
(a) providing a moving conveyor (2) configured to contact an edge of the sheet (13) and move the sheet (13) at a conveyance speed;
(b) providing a non-contact bearing (3) configured to eject gas against a portion of a major surface of the sheet (13); and
(c) contacting the edge of the sheet (13) with the moving conveyor (2) and moving the sheet (13) at the conveyance speed while ejecting gas from the non-contact bearing (3) against the portion of the major surface of the sheet (13);

wherein:
(i) the non-contact bearing (3) includes a plurality of orifices (22) which eject the gas against the portion of the major surface of the sheet (13),
(ii) the gas is provided to the orifices (22) from a plenum which operates at a pressure $P_{plenum}$;
(iii) the plurality of orifices (22) has a centermost orifice (26), and
(iv) the calculated static pressure $P_{midpoint}$ at the midpoints (27) between the centermost orifice (26) and each of its nearest neighbors (28) in a horizontal direction satisfies the relationship:

$$P_{midpoint}/P_{plenum} \geq 0.05$$

In accordance with a second aspect, there is provided a non-contact bearing (3) for use in transporting a glass sheet (13), the bearing (3) having a front surface (20) which has a plurality of orifices (22), the front surface (20) facing the glass sheet (13) and the orifices (22) ejecting gas towards a major surface of the glass sheet (13) during use of the bearing (3), wherein:
(a) the orifices (22) are distributed on the front surface (20) to form at least one row (210,220,230,240,250) that is oriented horizontally during use of the bearing (3);
(b) the orifices (22) have an average horizontal pitch P which satisfies the relationship:

$$40 \leq P \leq 75,$$

where P is in millimeters; and
(c) the orifices (22) have an average size $D_0$ which satisfies the relationship:

$$2.0 \leq D_0 \leq 3.8,$$

where $D_0$ is in millimeters.

The reference numbers used in the above summaries of the various aspects of the invention are only for the convenience of the reader and are not intended to and should not be interpreted as limiting the scope of the invention. More generally, it is to be understood that both the foregoing general description and the following detailed description are merely exemplary of the invention and are intended to provide an overview or framework for understanding the nature and character of the invention.

Additional features and advantages of the invention are set forth in the detailed description which follows, and in part will be readily apparent to those skilled in the art from that description or recognized by practicing the invention as described herein. The accompanying drawings are included to provide a further understanding of the invention, and are incorporated in and constitute a part of this specification. It is to be understood that the various features of the invention disclosed in this specification and in the drawings can be used in any and all combinations.

BRIEF DESCRIPTION OF THE DRAWINGS

FIG. 1A is a front view and FIG. 1B is a side view.

FIG. 3A is a front view and FIG. 3B is a side view.

DETAILED DESCRIPTION OF THE PREFERRED EMBODIMENTS

As discussed above, non-contact, gas-ejecting bearings for transporting glass sheets are provided. The bearing ejects a gas (e.g., air) against a portion of a major surface of the glass sheet. The gas is preferably air, although other gases may be used if desired.

The glass sheet is preferably suitable for use as a substrate in the manufacture of flat panel displays, such as LCD displays. At present, the largest substrates being provided to flat panel display manufacturers are known as "Gen 10" substrates and have dimensions of ~3000 mm×~3000 mm×0.7 mm. The non-contact bearings disclosed herein can be used with these substrates, as well as with larger substrates that may be developed in the future and smaller substrates which have been developed in the past.

Figures 1A, 1B:
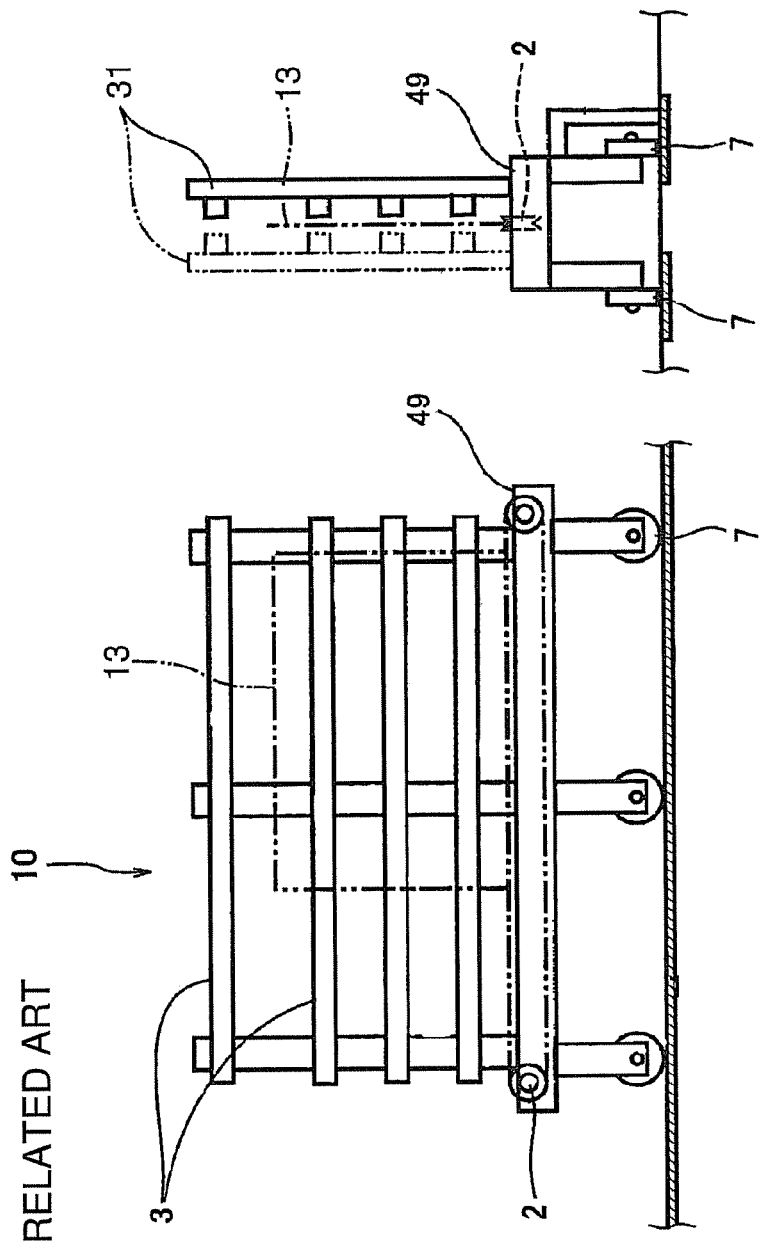
FIGS. 1A and 1B are schematic drawings of conveying apparatus for a glass sheet employing an array of non-contact, gas-ejecting bearings.

FIG. 1 shows a representative embodiment of apparatus 10 for conveying a glass sheet 13 using non-contact, gas-ejecting bearings 3. As shown in this figure, an array of bearings 3 are carried by supports 31. The supports, in turn, are carried by platform 49 which may include casters 7 for transporting the apparatus to different locations in a manufacturing plant.

The number of non-contact bearings used in any particular application, as well as the lengths of the individual bearings, will depend on the size of the glass sheet being conveyed, e.g., in the case of Gen 10 substrates, a preferred embodiment employs an array having on the order of 10 bearings, each bearing having a length of 1.5 meters. More or less bearings, as well as longer and shorter bearings, can, of course, be used as desired. For example, more bearings can be used if a glass sheet is being transported in a portrait orientation as opposed to a landscape orientation. In general terms, the bearings preferably have a vertical height in the range of 50-150 millimeters and, when an array of bearings is used, the vertical spacing between the bearings is preferably in the range of 200-400 millimeters. The horizontal extent of the bearing can be achieved by concatenating a plurality of bearing sections, each section having a length in the range of 200-600 millimeters.

The non-contact bearing(s) may be used on only one side of the sheet (see the solid lines in FIG. 1B) or may be disposed on both sides of the sheet (see the solid and dashed lines in FIG. 1B), depending upon the operation that is to be performed on the sheet. For example, the bearing(s) may be used for sheet support and conveyance during the cut-to-size, sheet rotation, sheet transport, sheet grinding, and sheet drying steps of the substrate manufacturing process. Examples of these and other applications for the bearing(s) can be found in U.S. Patent Application Publication No. US 2007/0271756, the contents of which are incorporated herein by reference in their entirety.

Supports 31 may hold the bearings in a vertical orientation as shown in FIG. 1 if gas-ejecting bearings are deployed on both sides of the glass sheet or at an angle displaced from vertical, e.g., at an angle in the range of 5-15° from vertical, if gas-ejecting bearings are used on only one side of the glass sheet, e.g., at angle 10° from vertical. (As used herein, the phrase "a substantially vertical orientation" means an orientation between 0° and 15° from vertical.) For bearings on both sides of the glass sheet, a vertical orientation is generally preferred; for bearings on only one side of the sheet, an orientation of 10° from vertical is generally preferred.

As shown in FIG. 1, platform 49 includes conveyor 2, e.g., a V-shaped or U-shaped belt, for engaging the bottom edge of sheet 13. The conveyor is driven by, for example, an electric motor (not shown) at the desired conveyance speed for the glass sheet. The conveyance speed will depend on the particular application. Preferably, the conveyance speed is equal to or greater than 15 meters/minute. For example, the conveyance speed may be in the range of 15 to 60 meters/minute, e.g., in the 40-60 meters/minute range, although slower speeds, e.g., speeds down to 7 meters/minute, as well as higher speeds can be used if desired.

Figure 2:
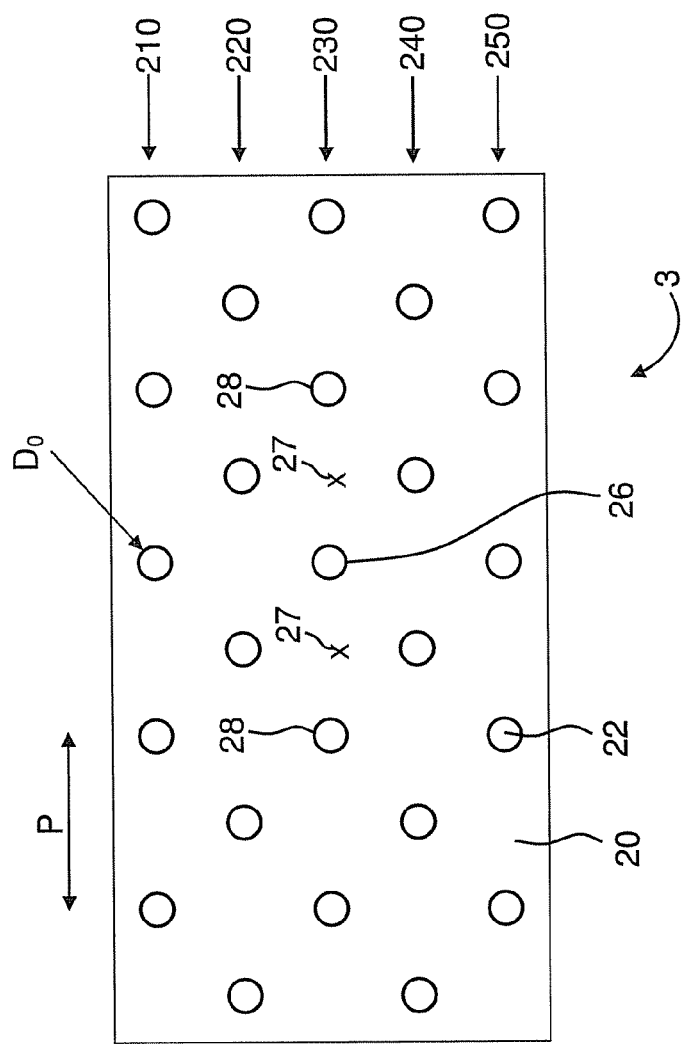
FIG. 2 is a schematic drawing of a portion of the front face of a non-contact, gas-ejecting bearing.

FIG. 2 shows the front surface (sheet facing surface) 20 of a center section of a representative gas-ejecting bearing 3. As can be seen in this figure, the front surface includes a plurality of orifices 22 arranged, in this case, in five rows 210, 220, 230, 240, 250, with each row having the same number of orifices and with the orifices in adjacent rows being horizontally offset. Also, in this figure, the orifices have a uniform size (i.e., a uniform diameter $D_0$). This arrangement has been found to work successfully in practice, but numerous variations of the arrangement can be used if desired. As representative examples, the gas-ejecting bearing can include more or less than five rows of orifices, the various rows can have different numbers of orifices, the orifices in adjacent rows can be vertically aligned, and the orifice sizes and the horizontal spacings (pitches) between some or all of the orifices can have different values. Also, the orifices need not be circular, in which case rather than being the orifice's diameter, the orifice's size is its maximum cross-sectional dimension.

During use, the orifices of bearing 3 are connected to a source of pressurized gas. For example, a pump can be used to feed pressurized gas to a plenum which distributes the gas to the various orifices. The plenum can be integral with the face of the bearing, e.g., the orifices can be holes on one surface of a hollow box which serves as a plenum. Alternatively, the plenum can be separate from the bearing and the gas can be provided through tubes, e.g., flexible tubes, connected to the entrance ends of the orifices on the back surface of the bearing. In this latter approach, the tube lengths should be chosen to avoid large pressure drops. A wide variety of commercially-available equipment, well known to those skilled in the art, can be used to provide the pressurized gas. Alternatively, customized equipment can be constructed if desired.

During use, sufficient gas must be emitted from the bearing(s) to form a cushion of gas that supports the glass sheet so that it does not contact the front surface of the bearing. Under static conditions, the force generated by the gas cushion merely needs to balance the gravitational force on the sheet. Under dynamic conditions, the interaction between the glass sheet and the bearing is more complicated. To begin with, the gas is ejected from the bearing at discrete locations, i.e., at the locations of the orifices. This produces a pressure profile in front of the bearing which comprises a plurality of "tent pole" like peaks, one peak at each of the orifices. As the glass moves over these "tent poles," it tends to deform (recall, as discussed above, that the glass sheet can be thought of as having mechanical properties not unlike those of tissue paper). This introduces vibration into the sheet which can cause it to contact the face of the gas bearing. Moreover, a moving glass sheet drags gas along with the sheet which creates a negative pressure. This negative pressure tends to pull the glass towards the bearing's face which compounds the vibration problem. In addition, the glass sheet itself may not be flat, e.g., it may exhibit bowing, waviness, warp, or other non-flat surface characteristics, thus providing another source for potential contact between the sheet and the bearing.

Figure 3:
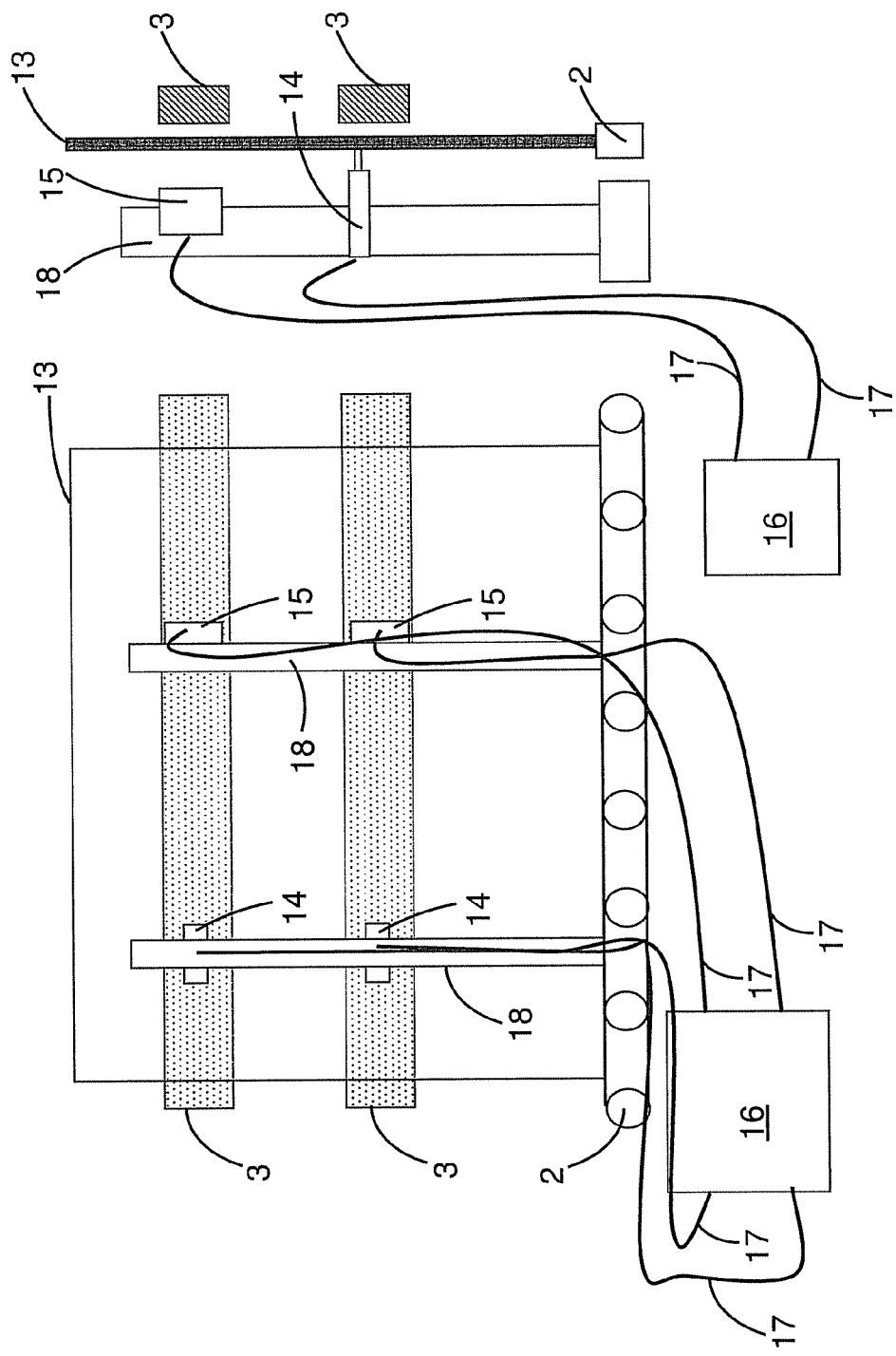
FIGS. 3A and 3B are schematic drawings of apparatus used in testing the effects of various parameters on the conveyance of glass sheets using non-contact, gas-ejecting bearings.

Using equipment of the type shown schematically in FIG. 3, experiments were performed to determine if the distribution and size of a gas bearing's orifices can be used to overcome this problem of contact between a glass sheet and a gas-ejecting bearing. In this figure, 13 is the glass sheet, 2 is a conveyor for the sheet, 3 is a gas-ejecting bearing, 14 is a force transducer, 15 is a position sensor, 18 is a transducer/sensor support, 17 are leads to the transducers and sensors, and 16 is equipment for recording the output of the transducers and sensors.

In these experiments, bearings having different distances (pitches) between orifices and different orifice sizes were tested for their effects on the vibration level exhibited by glass sheets conveyed past the bearings for different plenum pressures and different conveyance speeds. Based on these experiments, it was determined that:
  (a) the pitch between orifices in the horizontal direction, i.e., in the direction of motion of the glass sheet, is a primary variable in successfully conveying the sheets,
  (b) the pitch in the vertical direction is less important than the horizontal pitch,
  (c) in general terms, once a horizontal pitch has been chosen, the vertical pitch can lie in the range of about 0.5 to about 1.0 times the horizontal pitch,
  (d) as the sheet's conveyance speed increases, the horizontal pitch needs to be reduced,
  (e) higher plenum pressures lead to higher "tent poles" which leads to higher levels of vibration,
  (f) orifice size is also a primary variable in successfully conveying glass sheets,
  (g) as shown in Table 1, for a given horizontal pitch and conveyance speed, the glass float, i.e., the distance between the glass sheet and the bearing's face, increases and then decreases as the orifice size is increased,
  (h) as shown in Table 1, for a given horizontal pitch and conveyance speed, the maximum peak-to-peak vibration increases substantially monotonically with orifice size.

The data of Table 1 was obtained using an LCD glass substrate having a thickness of 0.7 millimeters. The face of the gas bearing was 500 millimeters long and 150 millimeters high and had five rows of gas orifices which were offset as shown in FIG. 2. The horizontal pitch was 50 millimeters and the vertical pitch was 30 millimeters. The gas was air, the plenum pressure was 300 pascals, and the conveyance speed was 60 meters/minute.

Computer modeling was also performed to determine the pressure distributions generated by a bearing as its parameters are varied. The calculations were performed using the commercially-available fluid dynamics program sold under the FLUENT trademark by ANSYS, Inc. (Canonsburg, Pa.). Other programs, including non-commercial programs, can, of course, be used to make the calculations.

Figure 4:
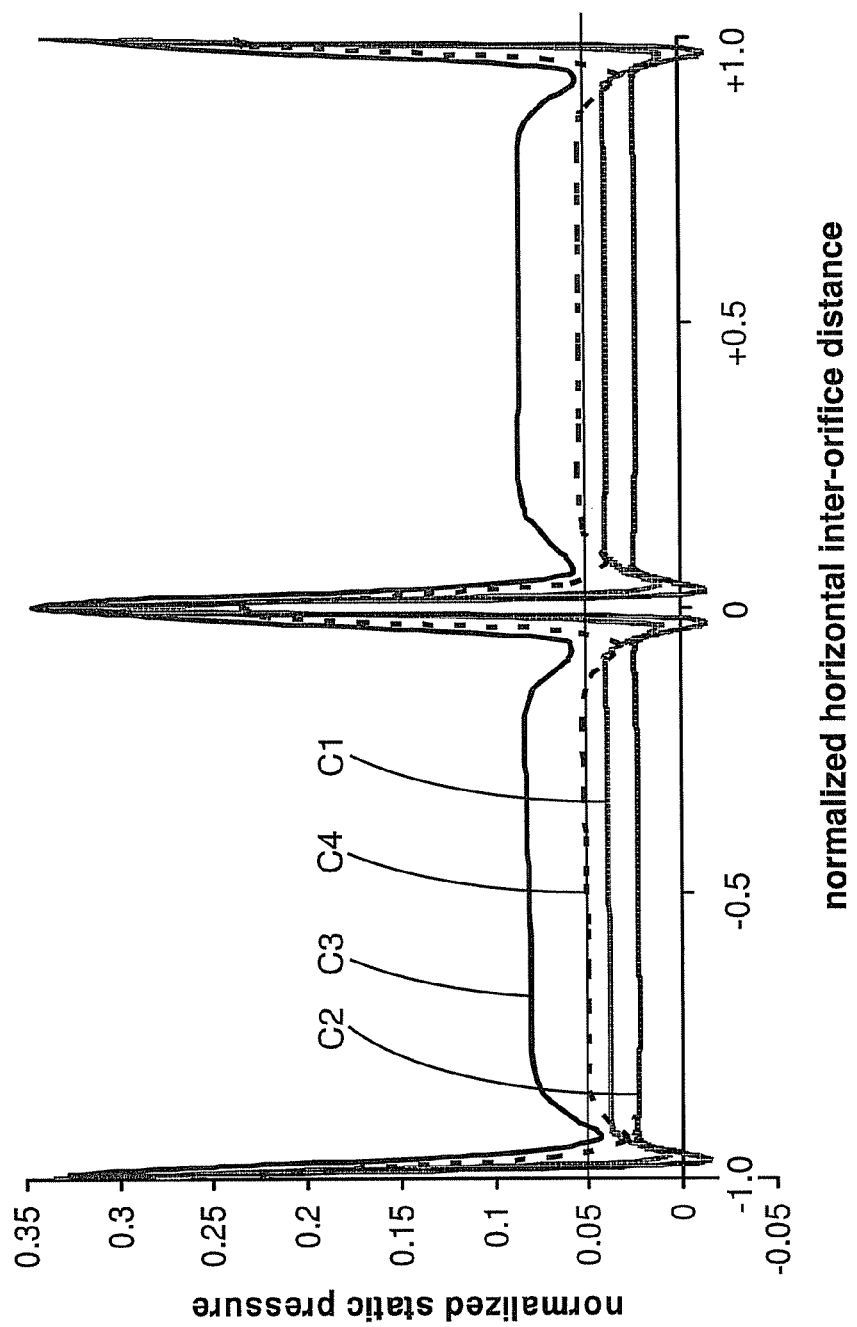
FIG. 4 is a plot of normalized static pressure versus normalized horizontal inter-orifice distance for the centermost orifice of a bearing of the type shown in FIG. 2 for the four cases of Table 2.

Table 2 shows a representative set of bearing parameters that was modeled. For the parameters of Table 2, FIG. 4 plots calculated normalized static pressure (i.e., the calculated static pressure divided by the plenum pressure used in the calculation) versus normalized horizontal inter-orifice distance (i.e., the distance from an orifice divided by the pitch between orifices) on a horizontal line passing through the centermost orifice of the bearing (i.e., the orifice at zero in FIG. 4) and its nearest neighbors (i.e., the orifices at −1.0 and +1.0). As can be seen, curves C1, C2, C3, and C4 of this figure, which correspond respectively to Cases 1, 2, 3, and 4 of Table 2, are substantially different for the four cases and thus provide an effective method for selecting the parameters of the bearing.

In particular, by comparing the curves of FIG. 4 with vibrational data obtained using equipment of the type shown in FIG. 3, it was determined that an important parameter for determining whether or not a particular set of bearing parameters will produce acceptable levels of vibration is the inter-orifice static pressure distribution. Although not wishing to be bound by any particular theory of operation, it is believed that to reduce vibration levels, the pressure produced by an individual orifice needs to overlap with the pressures produced by adjacent orifices. In practice, this overlapping is most conveniently quantified by computing the static pressure $P_{midpoint}$ at the midpoints between the centermost orifice of a bearing and each of its nearest neighbors in a horizontal direction. If that static pressure is at least 5% of the plenum pressure, i.e., if $P_{midpoint}/P_{plenum} \geq 0.05$ at each of the midpoints, the sheet's vibrational levels will be satisfactory, while if the static pressure is less than 5%, the vibrational levels will be excessive.

In FIG. 4, the midpoints correspond to the −0.5 and the +0.5 locations, and as can be seen in this figure, Cases 1 and 2 (curves C1 and C2) have $P_{midpoint}/P_{plenum}$ values that are less 0.05 and thus exhibit high levels of vibration, while Cases 3 and 4 (curves C3 and C4) have values equal to or greater than 0.05 and thus produce acceptable levels of vibration, with Case 3 being better than Case 4.

Using curves of the type shown in FIG. 4 and vibrational data obtained using equipment of the type shown in FIG. 3, it was further determined that bearings which produced acceptable levels of calculated inter-orifice pressures and sufficiently low levels of sheet vibration are characterized by orifices which have an average horizontal pitch in the range of 40-75 millimeters and an average size in the range of 2.0-3.8 millimeters, where in each case, the averages are over all of the orifices of the bearing. More preferably, the average horizontal pitch is in the range of 40-60 millimeters and, most preferably, in the range of 45-55 millimeters (e.g., approximately 50 millimeters). More preferably, the average orifice size is in the range of 2.8-3.8 millimeters, and most preferably, in the range of 3.2-3.8 millimeters (e.g., approximately 3.5 millimeters). For each of these ranges, the endpoints of the ranges are included within the range.

The above ranges for the average horizontal pitch and average orifice size parameters have been found to provide effective transport of glass sheets with controlled amounts of variation in the spacing between the glass sheet and the front surface of the bearing. In particular, when single-sided, non-contact, gas-ejecting bearings which (a) satisfy the $P_{midpoint}/P_{plenum} \geq 0.05$ criterion, (b) have an average orifice size in the range of 2.0 to 3.8 millimeters, and (c) have an average horizontal pitch in the range of 40 to 75 millimeters, are tested at a sheet conveyance angle of 10° C. from vertical and a conveyance speed in the range of 40-60 meters/minute using a glass sheet whose modulus is 73 GPa and whose dimensions are 2 meters long, 2 meters high, and 0.7 millimeters thick, the time-averaged spacing between the sheet and the front face of the bearing at all points on the front face of the bearing is in the range of 750-1250 microns and the time-averaged peak-to-peak variation in the spacing at all points on the front face of the bearing is no greater than 500 microns. Such a limited variation relative to the average spacing means that the likelihood of any part of the sheet contacting the bearing during transport of the sheet is negligible.

A variety of modifications that do not depart from the scope and spirit of the invention will be evident to persons of ordinary skill in the art from the foregoing disclosure. The following claims are intended to cover the specific embodiments set forth herein as well as modifications, variations, and equivalents of those embodiments.

TABLE 1

| Orifice size (mm) | Float (mm) | Vibration (mm) |
|---|---|---|
| 2 | 0.81 | 0.39 |
| 3 | 1.15 | 0.36 |
| 3.5 | 1.39 | 0.43 |
| 4 | 1.28 | 0.51 |
| 4.5 | 1.23 | 0.58 |
| 5 | 1.17 | 0.69 |

TABLE 2

| | Diameter of orifice (mm) | Pitch (mm) | Air bearing dimensions (mm × mm) | Force on glass (N) | Pressure (Pa) | Gas flow rate (Liter/s) |
|---|---|---|---|---|---|---|
| Case 1 | 3.5 | 100 | 500 × 150 | 0.483 | 6.44 | 1.737 |
| Case 2 | 2.5 | 100 | 500 × 150 | 0.296 | 3.95 | 1.135 |
| Case 3 | 3.5 | 50 | 275 × 150 | 0.498 | 12.1 | 1.741 |
| Case 4 | 3.0 | 50 | 275 × 150 | 0.3154 | 7.65 | 1.220 |

What is claimed is:

1. A method for conveying a glass sheet comprising:
   (a) providing a moving conveyor configured to contact an edge of the sheet and move the sheet at a conveyance speed;
   (b) providing a non-contact bearing configured to eject gas against a portion of a major surface of the sheet so as to hold the major surface of the sheet in an orientation wherein it is disposed at an angle from 0 to 15° from vertical; and
   (c) contacting the edge of the sheet with the moving conveyor and moving the sheet at the conveyance speed while ejecting gas from the non-contact bearing against the portion of the major surface of the sheet;

wherein:
   (i) the non-contact bearing includes a plurality of orifices which eject the gas against the portion of the major surface of the sheet,
   (ii) the gas is provided to the orifices from a plenum which operates at a pressure $P_{plenum}$,
   (iii) the plurality of orifices has a centermost orifice, and
   (iv) the calculated static pressure $P_{midpoint}$ at the midpoints between the centermost orifice and each of its nearest neighbors in a horizontal direction satisfies the relationship:

$$P_{midpoint}/P_{plenum} \geq 0.05.$$

2. The method of claim 1 wherein $P_{plenum}$ equals 300 pascals.

3. The method of claim 1 wherein the orifices' average horizontal pitch is in the range of 40-75 millimeters.

4. The method of claim 1 wherein the orifices' average horizontal pitch is in the range of 40-60 millimeters.

5. The method of claim 1 wherein the orifices' average horizontal pitch is in the range of 45-55 millimeters.

6. The method of claim 1 wherein the orifices' average size is in the range of 2.0-3.8 millimeters.

7. The method of claim 1 wherein the orifices' average size is in the range of 2.8-3.8 millimeters.

8. The method of claim 1 wherein the orifices' average size is in the range of 3.2-3.8 millimeters.

9. The method of claim 1 wherein the ratio of the orifices' average vertical pitch to the orifices' average horizontal pitch is between 0.5 and 1.0.

10. The method of claim 1 wherein the method has the further characteristic that when conveying a glass sheet whose modulus is 73 GPa and whose dimensions are 2 meters long, 2 meters high, and 0.7 millimeters thick, the time-averaged spacing between the sheet and a front face of the bearing at all points on the front face is in the range of 750-1250 microns and the time-averaged peak-to-peak variation in the spacing at all points on the front face is no greater than 500 microns for (i) a conveyance speed equal to 40 meters/minute, (ii) gas impingement against one side of the sheet, and (iii) a sheet angle of 10° from vertical.

11. The method of claim 10 wherein the conveyance speed is equal to 60 meters/minute.

* * * * *